US009281059B2

(12) United States Patent
Taylor (10) Patent No.: US 9,281,059 B2
(45) Date of Patent: *Mar. 8, 2016

(54) THYRISTOR MEMORY CELL INTEGRATED CIRCUIT

(71) Applicants: Opel Solar, Inc., Storrs Mansfield, CT (US); The University of Connecticut, Farmington, CT (US)

(72) Inventor: Geoff W. Taylor, Mansfield, CT (US)

(73) Assignees: Opel Solar, Inc., Storrs Mansfield, CT (US); The University of Connecticut, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/609,064

(22) Filed: Jan. 29, 2015

(65) Prior Publication Data

US 2015/0138881 A1    May 21, 2015

Related U.S. Application Data

(63) Continuation of application No. 13/951,578, filed on Jul. 26, 2013, now Pat. No. 8,947,925, which is a continuation-in-part of application No. PCT/US2012/051265, filed on Aug. 17, 2012.

(51) Int. Cl.
*G11C 11/34* (2006.01)
*G11C 13/00* (2006.01)
(Continued)

(52) U.S. Cl.
CPC ............ *G11C 13/0004* (2013.01); *G11C 11/39* (2013.01); *G11C 13/0097* (2013.01);
(Continued)

(58) Field of Classification Search
CPC .................................................. G11C 13/0004

USPC .......................................................... 365/163
See application file for complete search history.

(56) References Cited

U.S. PATENT DOCUMENTS 4,879,682 A    11/1989 Engles
5,557,777 A     9/1996 Culbert
(Continued)

FOREIGN PATENT DOCUMENTS

EP           1282130 B1    6/2006
WO     WO 02/071490 A1    9/2002
WO   WO 2013/025964 A1    2/2013

OTHER PUBLICATIONS

The Quest for a Universal Memory, Gill Lee, IEEE Spectrum, May 17, 2012.
(Continued)

*Primary Examiner* — Son Mai
(74) *Attorney, Agent, or Firm* — Gordon & Jacobson, P.C.

(57) ABSTRACT

A semiconductor memory device including an array of memory cells (MC) formed on a substrate each realized from a load element and thyristor that define a switchable current path whose state represents a volatile bit value stored by the MC. At least one word line corresponding to a respective row of the array is formed on the substrate and coupled to MC current paths for the corresponding row. Bit lines corresponding to respective columns of the array are formed on the substrate and can be coupled to a modulation doped QW interface of the MC thyristors for the corresponding column. Circuitry is configured to apply an electrical signal to the word line(s) in order to generate current that programs phase change material of the MC load elements into one of a high or low resistive state according to state of the current path of the MCs for non-volatile backup purposes.

19 Claims, 8 Drawing Sheets

(51) Int. Cl.
*G11C 11/39* (2006.01)
*G11C 14/00* (2006.01)
*H01L 27/24* (2006.01)
*H01L 45/00* (2006.01)

(52) U.S. Cl.
CPC .......... *G11C14/009* (2013.01); *G11C 14/0045* (2013.01); *H01L 27/2445* (2013.01); *H01L 27/2463* (2013.01); *H01L 45/06* (2013.01); *H01L 45/1233* (2013.01)

(56) References Cited

U.S. PATENT DOCUMENTS

| | | | |
|---|---|---|---|
| 5,790,583 A | 8/1998 | Ho | |
| 6,031,243 A | 2/2000 | Taylor | |
| 6,118,908 A | 9/2000 | Bischel et al. | |
| 6,479,844 B2 | 11/2002 | Taylor | |
| 6,639,930 B2 | 10/2003 | Griffel et al. | |
| 6,841,795 B2 | 1/2005 | Taylor et al. | |
| 6,849,866 B2 | 2/2005 | Taylor | |
| 6,853,014 B2 | 2/2005 | Taylor et al. | |
| 6,865,314 B1 | 3/2005 | Blair et al. | |
| 6,870,207 B2 | 3/2005 | Taylor | |
| 6,873,273 B2 | 3/2005 | Taylor et al. | |
| 6,954,473 B2 | 10/2005 | Dehmubed et al. | |
| 7,283,383 B2 | 10/2007 | Kang | |
| 7,332,752 B2 | 2/2008 | Taylor et al. | |
| 7,619,917 B2 | 11/2009 | Nirschl et al. | |
| 7,657,132 B1 | 2/2010 | Yap et al. | |
| 7,894,255 B1 | 2/2011 | Nemati et al. | |
| 8,159,868 B2 | 4/2012 | Widjaja | |
| 8,194,451 B2 | 6/2012 | Widjaja | |
| 8,208,294 B2 | 6/2012 | Happ et al. | |
| 8,576,607 B1 | 11/2013 | Nemati | |
| 8,947,925 B2 * | 2/2015 | Taylor | 365/163 |
| 2002/0176087 A1 | 11/2002 | Numai | |
| 2004/0188669 A1 | 9/2004 | Atanackovic et al. | |
| 2009/0129157 A1 | 5/2009 | Honda et al. | |
| 2009/0164814 A1 | 6/2009 | Axford et al. | |
| 2010/0293350 A1 | 11/2010 | Happ et al. | |
| 2013/0163323 A1 | 6/2013 | Yasutake | |

OTHER PUBLICATIONS

U.S. Appl. No. 08/949,504, filed Oct. 14, 1997, Geoff W. Taylor et al.
U.S. Appl. No. 09/710,217, filed Nov. 10, 2000, Geoff W. Taylor et al.
U.S. Appl. No. 60/376,238, filed Apr. 26, 2002, Geoff W. Taylor et al.
U.S. Appl. No. 10/323,513, filed Dec. 18, 2002, George Pacheco et al.

* cited by examiner

Thyristor Memory Cell: Universal Memory Element

- A minimum size cell (crosspoint of an array) performs all memory functions → SRAM, DRAM or NV
- Mode of operation may be alternated between DRAM and SRAM to trade off speed for power
- NV operation can be enabled at any time, e.g. a decreasing power supply voltage could activate the NV write operation so that all data is captured
- Optoelectronic operation is utilized for specific applications such as photonic buffer memories
- Scaling superiority: thyristor/HFETs scale to <20nm nodes much more easily than CMOS because oxide scaling is eliminated
- Full compatibility with full spectrum of optical and optoelectronic circuit functions
- Advantage over Memristor  a) only 1 polarity of voltage required
  b) optoelectronic compatible

FIG. 8

THYRISTOR MEMORY CELL INTEGRATED CIRCUIT

CROSS-REFERENCE TO RELATED APPLICATIONS

The present application is a continuation of U.S. application Ser. No. 13/951,578, filed on Jul. 26, 2013, which is a continuation-in-part of International Appl. No. PCT/US2012/051265, filed on Aug. 17, 2012, which are hereby incorporated by reference in their entireties.

BACKGROUND

1. Field

The present application relates to integrated circuits. More specifically, the present application relates to memory integrated circuits that store data bit values in an array of memory cells.

2. State of the Art

Memory system designers have struggled for years and continue to struggle to find a solution that provide the density of dynamic random access memory (DRAM), the high speed operations of static random access memory (SRAM) along with the capability of backing up the volatile bit values of the memory system into a non-volatile form for ultra-low power modes and/or power supply failures.

SUMMARY

The present application is directed to a semiconductor memory device that includes an array of memory cells formed on a substrate. Each given memory cell of the array includes a resistive load element and a thyristor device that define a switchable current path through the resistive load element and the thyristor device of the given memory cell. The resistive load element is realized from a phase change material that can be selectively programmed into one of a high resistive state and a low resistive state by current that flows through the switchable current path of the given memory cell. The state of the switchable current path of the given memory cell represents a volatile bit value stored by the given memory cell. At least one word line corresponding to a respective row of the array is formed on the substrate. A given word line is coupled to the switchable current path through the resistive load element and thyristor device of the memory cells for the corresponding row of the array. A plurality of bit lines corresponding to respective columns of the array is formed on the substrate and interface to the thyristor of the memory cells for the corresponding column of the array. The memory device also includes circuitry configured to apply a first electrical signal to the least one word line of the array in order to generate current that programs the phase change material of the resistive load elements of memory cells of the array into one of the high resistive state and the low resistive state according to the state of the switchable current path of the memory cells of the array for non-volatile backup of the volatile bit values stored by the memory cells of the array.

In one embodiment, the first electrical signal is applied to the every word line of the array and comprises a first time-varying voltage signal that generates current that programs the phase change material of the resistive load elements of the memory cells of the array.

For the memory cells of the array where the switchable current path of the given memory cell is in a non-conducting/OFF state corresponding to a volatile "0" bit value, the first time-varying voltage signal can produce current that transforms the phase change material of the resistive load element of the given memory cell by melting to the high resistance state corresponding to a non-volatile "0" bit value. For memory cells of the array where the switchable current path of the given memory cell is in a conducting/ON state corresponding to a volatile "1" bit value, the first time-varying voltage signal can produce current that does not transform the phase change material of the resistive load element of the given memory cell such that it remains in a low resistance state corresponding to a non-volatile "1" bit value.

The circuitry of the memory device can be further configured to apply a second electrical signal (such as a second time-varying voltage signal) to every word line of the array in order to generate current that programs the phase change material of the resistive load elements of memory cells of the array into the low resistive state as well as setting the state of the switchable current path of the memory cells of the array according to the non-volatile bit values stored by the memory cells of the array for restore of the volatile bit values stored by the memory cells of the array from non-volatile backup.

For memory cells of the array where the phase change material of the resistive load element of the given memory cell is in a high resistance state corresponding to a non-volatile "0" bit value, the second time-varying voltage signal can produce a current that transforms the phase change material of the resistive load element of the given memory cell by recrystallization into the low resistance state and sets the state of the switchable current path of the given memory cell into an non-conducting/OFF state corresponding to a volatile "0" bit value. For memory cells of the array where the phase change material of the resistive load element of the given memory cell is in a low resistance state corresponding to a non-volatile "1" bit value, the second time-varying voltage can produce a current that does not transform the phase change material of the resistive load element of the given memory cell such that it remains in the low resistance state and sets the state of the switchable current path of the given memory cell into a conducting/ON state corresponding to a volatile "1" bit value.

In one embodiment, the second time-varying voltage signal includes a pulse followed by a reduction in voltage to a level below the switching voltage of the thyristor devices of the memory cells of the array.

The thyristor devices of the memory cells of the array can include a first-type modulation doped quantum well interface spaced from a second-type modulation doped interface. The bit lines can be coupled to the first-type modulation doped quantum well interface of the memory cells for a corresponding column of the array. A plurality of erase lines corresponding to respective columns of the array can be formed on the substrate. A given erase line can be coupled to the second-type modulation doped quantum well interface of the memory cells for the corresponding column of the array.

In one embodiment, the semiconductor memory device further includes an address bus, a data bus, and a control bus. Row address decoding circuitry is operably coupled to the address bus. The row address decoding circuitry can be configured to select a word line as dictated by a row address input on the address bus. Word line driver circuitry is operably coupled to the row address decoding circuitry. The word line driver circuitry can be configured to apply signals to the selected word line. Column address decoding circuitry is operably coupled to the address bus. The column address decoding circuitry can be configured to select a bit line as dictated by a column address input on the address bus. Bit line amplifier and driver circuitry is operably coupled to the column address decoding circuitry and the bit lines of the array.

The bit line amplifier and driver circuitry can be configured to apply or process signals carried on the selected bit line. Erase line driver circuitry is operably coupled to the column address decoding circuitry and the erase lines of the array. The erase line driver circuitry can be configured to apply signals carried on the selected erase line. A data input circuit and a data output circuit is operably coupled to the data bus. IO gate circuitry is operably coupled between bit line amplifier and driver circuitry and both the data input circuit and the data output circuit, and is also operably coupled between erase line driver circuitry and the data input circuit. Control circuitry is operably coupled to the control bus. The control circuitry can be configured to control operations of the semiconductor memory device according to control data input on the control bus.

In the preferred embodiment, the circuitry that applies the first electrical signal to the word line(s) of the array operates in response to circuitry that detects presence of a predetermined event or signal. The predetermined event or signal can be triggered by at least one of a predetermined user input, a predetermined low power operational mode of a processing system, and a reduction in power supplied to the device.

The thyristor devices of the memory cells of the array can be realized from an epitaxial layer structure formed on the substrate that defines complementary n-type and p-type modulation doped quantum well interfaces. The epitaxial layer structure can include an N+ type doped layer, a first plurality of layers forming a p type modulation doped quantum well interface spaced from the N+ type doped layer, a second plurality of layers forming an n-type modulation doped quantum well interface, the first plurality of layers being separated from the second plurality, and a P+ type doped layer spaced from the second plurality of layers. The n-type modulation doped quantum well interface includes at least one quantum well separated from an n-type doped charge sheet by at least one undoped spacer layer. The p-type modulation doped quantum well interface includes at least one quantum well separated from a p-type doped charge sheet by at least one undoped spacer layer. The p-type modulation doped quantum well interface can be formed above the N+ type doped layer.

The phase change material of the resistive load elements of the memory cells of the array can be realized from a chalcogenide glass material.

The memory cells can be configured for DRAM-like operation where the volatile bit values stored by the state of the switchable current path of the memory cells are periodically refreshed between low power dynamic storage states.

DETAILED DESCRIPTION OF THE PREFERRED EMBODIMENTS

Figure 1:
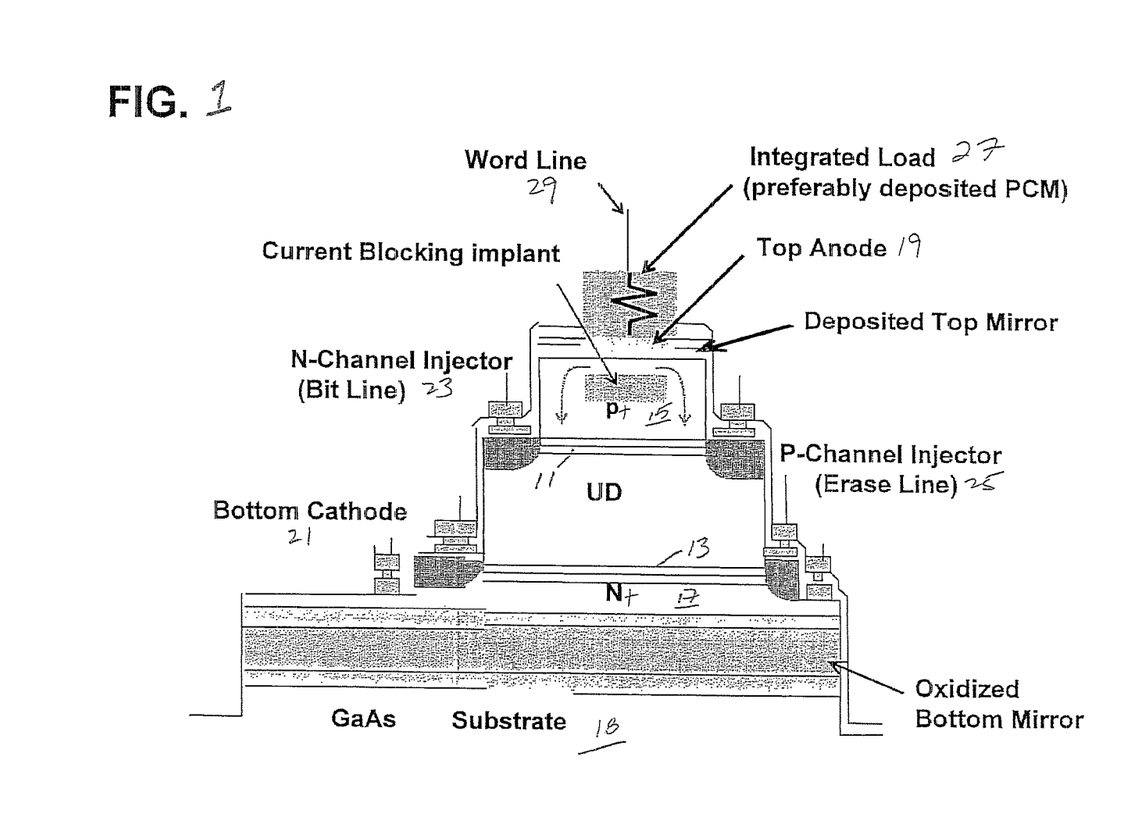
FIG. 1 is a schematic diagram of a thyristor memory cell integrated circuit according to the present application.
Figure 3:
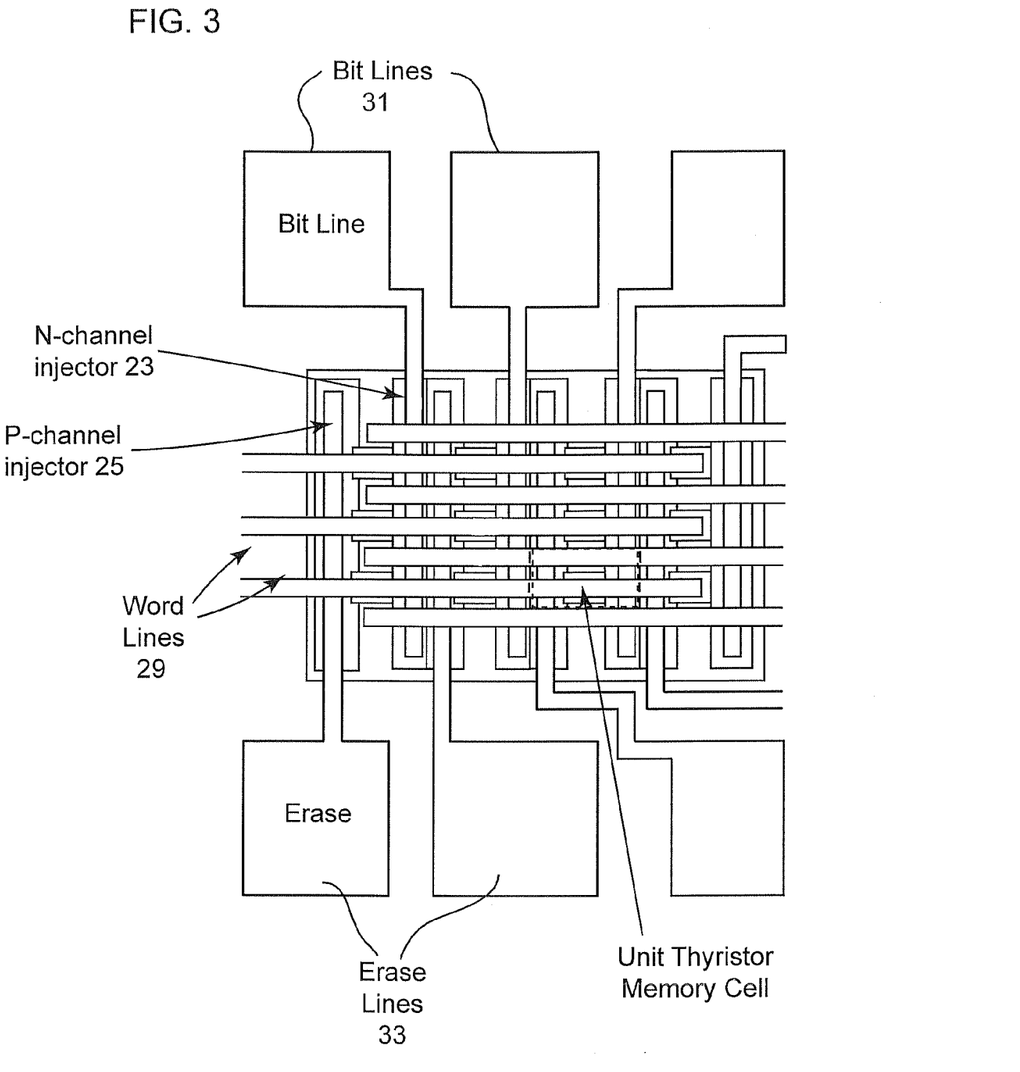
FIG. 3 is a schematic top view of an exemplary thyristor memory cell integrated circuit according to the present application.

FIG. 1 is a schematic diagram of a thyristor memory cell integrated circuit according to the present application. The thyristor memory cell integrated circuit includes an array of thyristor memory cells integrally formed on a substrate where each thyristor memory cell includes two devices—a thyristor device and a resistive load element. The thyristor device and the resistive load element define a switchable current path through the thyristor device and the resistive load element, where the current path is switched ON when the thyristor device operates in its conducting/ON state and where the current path is switched OFF when the thyristor device operates in its non-conducting/OFF state. The thyristor device includes complementary n-type and p-type modulation doped quantum well (QW) interfaces 11, 13 formed between top P+ layer(s) 15 and bottom N+ layer(s) 17 on a substrate 18. In one embodiment, the thyristor device is defined by a mesa that includes a refractory anode terminal 19 formed above the top P+ layer 15. A cathode terminal 21 is operably coupled to the bottom N+ layer 17. The potential of the cathode terminal 21 is fixed at ground or a negative potential. An re-channel injector terminal 23 and a p-channel injector terminal 25 are electrically coupled to the n-type and p-type modulation doped quantum well interfaces 11, 13, respectively. The resistive load element 27 can be integrally formed above the top anode terminal 19. In one embodiment, the resistive load element 27 is realized by a phase change material sandwiched between the anode terminal 19 and a portion of a top refractory electrode that defines a word line 29 coupled to each thyristor memory cell in a row of the array. Thus, there is a word line 29 for each row of the array (FIG. 3). The word line 29 can be realized from tungsten or other suitable metal. The n-channel injector terminal 23 for each thyristor memory cell in a column of the array is electrically coupled to a bit line (which can be realized from copper or other suitable metal). Thus, there is a bit line for each column of the array (FIG. 3). The p-channel injector terminal 25 for each thyristor memory cell in a column of the array is electrically coupled to an erase line (which can be realized from copper or other suitable metal). Thus, there is an erase line for each column of the array (FIG. 3).

Preferably, the thyristor memory cell integrated circuit (and possibly other optoelectronic devices, logic circuits and/or signal processing circuits that are fabricated integral thereto) are realized from the inversion quantum-well channel device structures similar to those described in detail in U.S. Pat. No. 6,031,243; U.S. patent application Ser. No.

09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties. With these structures, a fabrication sequence is used to make all the devices, including an array of thyristor memory cells and supporting electrical and/or optoelectronic devices on a common substrate. In other words, n type and p type contacts, critical etches, etc. are used to realize all of these devices simultaneously on a common substrate. The essential features of this device structure include 1) an n-type modulation doped QW interface 11 and a p-type modulation doped QW interface 13, 2) self-aligned n-type and p-type channel contacts formed by ion implantation, 3) n-type metal for the n-channel injector 23 in contact with the n-type ion implants and the n-type modulation doped QW interface 11 as well as n-type metal for the bottom cathode terminal 21 in contact with the bottom n-type layer 17, 4) p-type metal for the p-type channel injector 25 in contact with the p-type ion implants and the p-type modulation doped QW interface 13 as well as p-type metal for the top anode electrode 19 in contact with the top p-type layer 15; and 5) a current blocking and steering implant in the top p-type region above the n-type modulation doped quantum well interface 11. The n-type modulation doped quantum well interface 11 includes at least one quantum well separated from an n-type doped charge sheet by at least one undoped spacer layer. The p-type modulation doped quantum well interface 13 includes at least one quantum well separated from a p-type doped charge sheet by at least one undoped spacer layer. The active device structures are preferably realized with a material system of group III-V materials (such as a GaAs/AlGaAs).

In one embodiment, the resistance of the phase change material of the resistive load element 27 of a given thyristor memory cell can be changed between a high resistance phase and a low resistance phase (or vice-versa) in response to electrical current signals that are supplied to the resistive load element 27 via the word line 29 and that flows through the phase change material of the resistive load element 27. The phase change material can be a chalcogenide glass material that is capable of changing phase between a high resistance amorphous phase and a low resistance crystalline phase (and vice versa) by Joule heating of the material through application of current to the material. This operation allows the thyristor memory cell to function in a non-volatile manner. The thyristor memory cell can also function as a volatile static memory cell that does not require periodic refresh, or as a volatile dynamic memory cell that does require periodic refresh as described below.

The thyristor device of the thyristor memory cell switches from a non-conducting/OFF state (where the current I through the thyristor device between the top anode terminal 19 and the bottom cathode terminal 21 is substantially zero) to a conducting/ON state (where the current I is substantially greater than zero) when:

i) the anode terminal 19 is forward biased (e.g. biased positively) with respect to the cathode terminal 21 by applying suitable bias signals applied to the anode terminal 19 via the word line 29; and ii) the voltage potential between n-channel injector electrode 23 and the anode terminal 19 is forward biased by applying suitable bias signals to the n-channel injector electrode 23 via the bit line and to the anode terminal 19 via the word line 29 such that the level of charge in the n-type modulation doped QW interface 11 exceeds the critical switching charge $Q_{CR}$, which is that charge that reduces the forward breakdown voltage such that no OFF state bias point exists.

The voltage potential between the p-channel injector terminal 25 and the cathode terminal 21 can also be configured by a suitable bias signal applied to the p-channel injector terminal 25 via the erase line to produce a charge in the p-type modulation doped QW interface 13 that is greater than the critical switching charge $Q_{CR}$, which is that charge that reduces the forward breakdown voltage such that no OFF state bias point exists. The critical switching charge $Q_{CR}$ is unique to the geometries and doping levels of the device.

The thyristor device of the thyristor memory cell switches from the conducting/ON state to the non-conducting/OFF state when the charge in the n-type modulation doped QW interface 11 (or the charge in the p-type modulation doped QW interface 13) decreases below the holding charge $Q_H$, which is the critical value of the channel charge which will sustain holding action (i.e., the conducting/ON state). The thyristor device can be switched into the non-conducting/OFF state by applying suitable bias signals to anode terminal 19 via the word line 29 and to the n-channel injector terminal 23 via the bit line and/or to the p-channel injector terminal 25 via the erase line such that the charge in the n-type modulation doped QW interface 11 (or the charge in the p-type modulation doped QW interface 13) decreases below the holding charge $Q_H$. The holding charge $Q_H$ is unique to the geometries and doping levels of the device.

Figure 2:
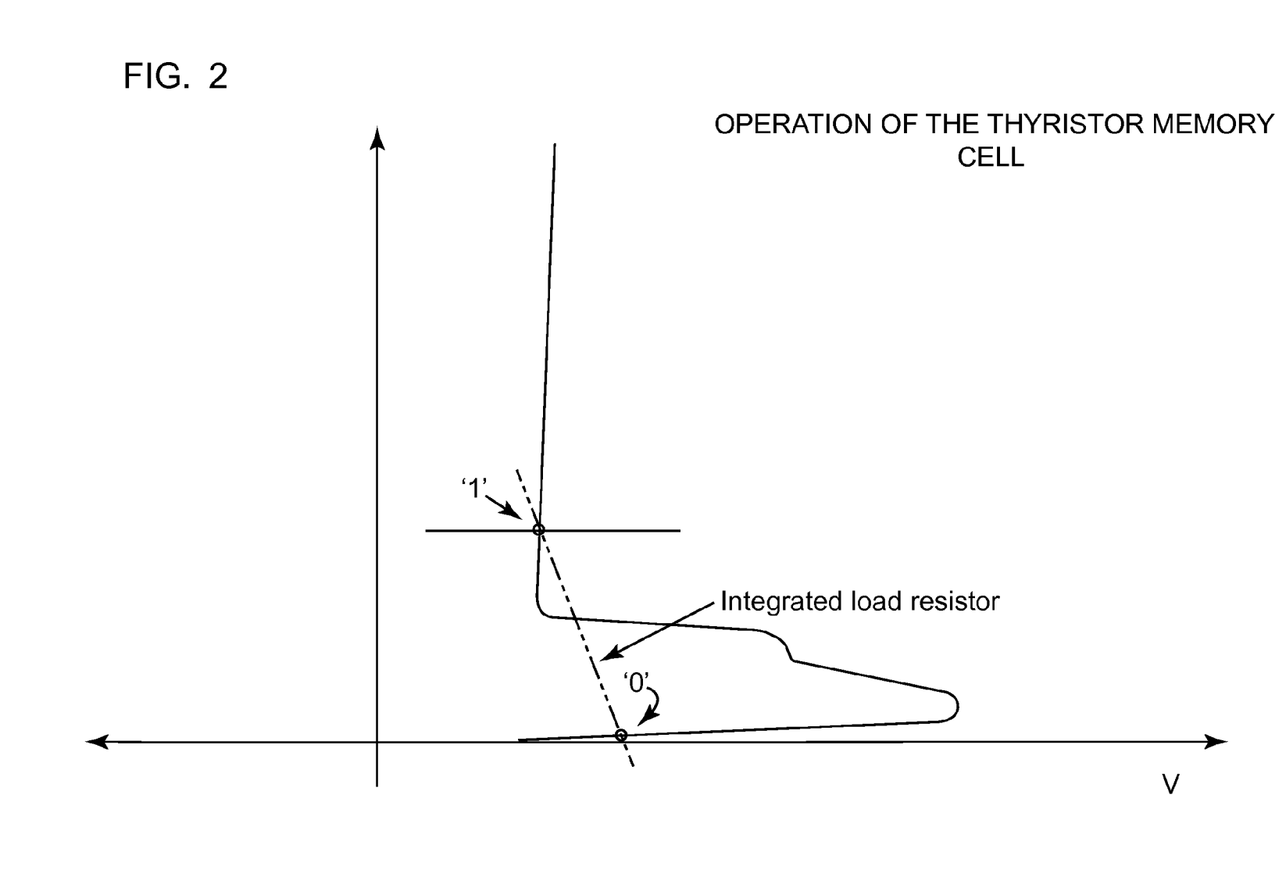
FIG. 2 is a diagram showing the current-voltage characteristics of a resistive load element and thyristor device of the thyristor memory cell of FIG. 1, including such current-voltage characteristics corresponding to volatile "0" and "1" bit values.

FIG. 2 shows the current-voltage characteristics of a thyristor device of the thyristor memory cell of FIG. 1. The thyristor device has the non-conducting/OFF state and the conducting/ON state to store a volatile "0" bit value and volatile "1" bit value, respectively. With the thyristor device operated this way, it has the function of a flip flop. Therefore, it operates similar to an ideal volatile static RAM (SRAM) cell. The thyristor memory cell has two devices (a thyristor device and a resistive load element), which is less than a flip flop (typically realized by a 6T cell) and thus provides a smaller footprint and higher speed.

The conducting/ON state and the non-conducting/OFF state of the thyristor device of the thyristor memory cell stores volatile "1" and "0" bit values, respectively. In the conducting/ON state of the thyristor device (volatile "1" bit value), current flows through the resistive load element 27 into the anode terminal 19 and through the thyristor device to the bottom cathode terminal 21 (which is fixed to ground or negative potential). This current causes a positive voltage difference between the re-channel injector terminal 23 (and the bit line) and the cathode terminal 21. In the non-conducting/OFF state of the thyristor device (volatile "0" bit value), current does not flow through the resistive load element 27 into the anode terminal 19 and through the device, thus providing minimal voltage difference between the between the n-channel injector terminal 23 (and the bit line) and the cathode terminal 21.

For read operations, a voltage pulse is applied to the word line 29, and the voltage signal of the n-channel injector terminal 23 (and the bit line) represents the volatile bit value of the thyristor memory cell.

For write operations, the thyristor device of the thyristor memory cell can be programmed electrically into the conducting/ON state (volatile "1" bit value) by applying suitable bias signals to top anode terminal 19 via the word line 29 and to the re-channel injector electrode 23 via the bit line in order to produce a charge in the n-type modulation doped QW interface 11 of the thyristor device that is greater than the critical switching charge $Q_{CR}$. The thyristor device of the thyristor memory cell can be programmed electrically into the non-conducting/OFF state (volatile "0" bit value) by applying suitable bias signals to anode terminal 19 via the word line 29 and to the re-channel injector terminal 23 via the bit line and/or to the p-channel injector terminal 25 via the erase line such that the charge in the n-type modulation doped QW interface 11 (or the charge in the p-type modulation doped QW interface 13) decreases below the holding charge $Q_H$.

For non-volatile operations, the resistive load element 27 of the thyristor memory cell can be programmed into a high resistance state (NV "0" bit value) by applying a suitable bias signal to the word line 29 of the thyristor memory cell in order to produce a melting of the phase change material of the resistive load element 27, which causes a change to an amorphous/highly resistive state corresponding to the NV "0" bit value. The resistive load element 27 of the thyristor memory cell can be programmed into a low resistance state (NV "1" bit value) by applying suitable bias signals to the word line 29 of the thyristor memory cell in order to produce current that recrystallizes the phase change material of the resistive load element 27 into its crystalline low resistance state corresponding to the NV "1" bit value.

In one embodiment, the resistive load elements 27 of the thyristor memory cells are selectively programmed into a high resistance state or low resistance state according to the volatile "0" or "1" bit values (OFF/ON states) of the thyristor memory cells of the array. Such programming operations allow for non-volatile storage and backup of the bit values of the thyristor memory cells of the array, which can be used for certain power modes (i.e., for low-power sleep state or upon sudden loss of power).

The programming of the resistive load elements 27 of the thyristor memory cells can be carried out by a global write "0" operation where a voltage pulse is applied to the word lines 29 of the array. The magnitude of such voltage pulse is above the "quiescent switching voltage" of the thyristor devices of the thyristor memory cells. In conjunction with this pulse, the n-channel injector (bit line) and the p-channel injector (erase line) of the thyristor memory cells float in a high impedance state. For the thyristor memory cells that are in the non-conducting/OFF state (volatile "0" bit value), this pulse will produce a displacement current that causes the phase change material of the resistive load element 27 of the thyristor memory cell to transform by melting to the high resistance state corresponding to the NV "0" bit value. However, for the thyristor memory cells that are in the conducting/ON state (volatile "1" bit value), this pulse will not produce the necessary displacement current (instead, it produces only a conduction current change) and the phase change material of the resistive load element 27 of such thyristor memory cells remains in the low resistance state corresponding to the "NV "1" bit value. In this manner, the global write "0" operation transforms the phase change material of the resistive load elements 27 of the thyristor memory cells of the array that are in the non-conducting/OFF state (volatile "0" bit value) to the high resistance state corresponding to the NV "0" bit value, and does not transform the phase change material for the resistive load elements 27 of the thyristor memory cells of the array that are in the conducting/ON state (volatile "1" bit value) from the low resistance state corresponding to the NV "1" bit value.

The volatile bits values of the thyristor memory cells can be restored from the programmed NV bit values. Such restore operations allow for programming of the volatile bit values of the thyristor memory cells for normal operation following the low power NV backup mode. Such restore operations can be carried out by a global clear "0" operation where a voltage pulse is applied to the word lines 29 of the array. The magnitude of the pulse is above the "quiescent switching voltage" of the thyristor devices of the thyristor memory cells of the array. In conjunction with this pulse, the n-channel injector (bit line) is biased and p-channel injector (erase line) of the thyristor memory cells floats in a high impedance state. For the thyristor memory cells with the phase change material of the resistive load element 27 in the high resistance state corresponding to the NV "0" bit value, this pulse will produce a displacement current that causes the phase change material of the resistive load element 27 to transform by recrystallization into the low resistance state. Such displacement current is designed to be less than the displacement current that causes the phase change material of the resistive load element 27 to transform by melting to the high resistance state. The transformation pulse is short enough that the QW interfaces 11, 13 of the thyristor devices have insufficient time to be populated and thus these thyristor devices do not switch into the conducting/ON state, i.e. they remain in the non-conducting/OFF state corresponding to the volatile "0" value. After the transformation pulse, the voltage potential applied to the word lines 29 of the array is reduced to a level below the characteristic switching voltage to cause the transformed thyristor memory cells to operate in the non-conducting/OFF state and assume the desired volatile "0" bit value. For the thyristor memory cells with the phase change material of the resistive load element 27 in the low resistance state corresponding to the NV "1" bit value, the transformation pulse will not produce the necessary displacement current for the transformation of the phase change material of the resistive load element 27. Instead, the transformation pulse produces a conduction current that causes the thyristor devices of the memory cells to operate in the conducting/ON state and assume the desired volatile "1" bit value, and they remain ON when the voltage level is reduced to the level below the holding voltage (because their QW interfaces were already populated and this charge has does not have sufficient time to dissipate in contrast to the transformed thyristor memory cells).

FIG. 3 shows a schematic top view of an exemplary thyristor memory cell integrated circuit according to the present application. The array of memory cells is organized in two dimensions as rows and columns. The n-channel injector 23 and the p-channel injector 25 for each column of the array are coupled to a bit line 31 and erase line 33, respectively, for the given column. The word line 29 for each row of the array is coupled to the load resistor elements for the memory cells of the given row.

In one embodiment, the write operations involve writing a volatile "0" bit value globally (to all of the thyristor memory cells of the array), and then writing volatile "1" bit values to the appropriate thyristor memory cells of the array one column at a time. Read operations can be performed on the thyristor memory cells of the array as required. During the time between a write and read operation, a forward bias (e.g.

biased positively) can be applied between the anode terminal and the cathode terminal of the thyristor device of a given thyristor memory cell, and the latching behavior of the thyristor device stores the bit value of the given thyristor memory cell.

The resistive load element 27 of the thyristor memory cell is a thin film resistor that can be integrated above the top anode 19 of the thyristor device of the thyristor memory cell. Therefore the footprint of the thyristor memory cell is the crosspoint of an array, i.e. the intersection of two minimum line features. This provides for high density.

Figure 4:
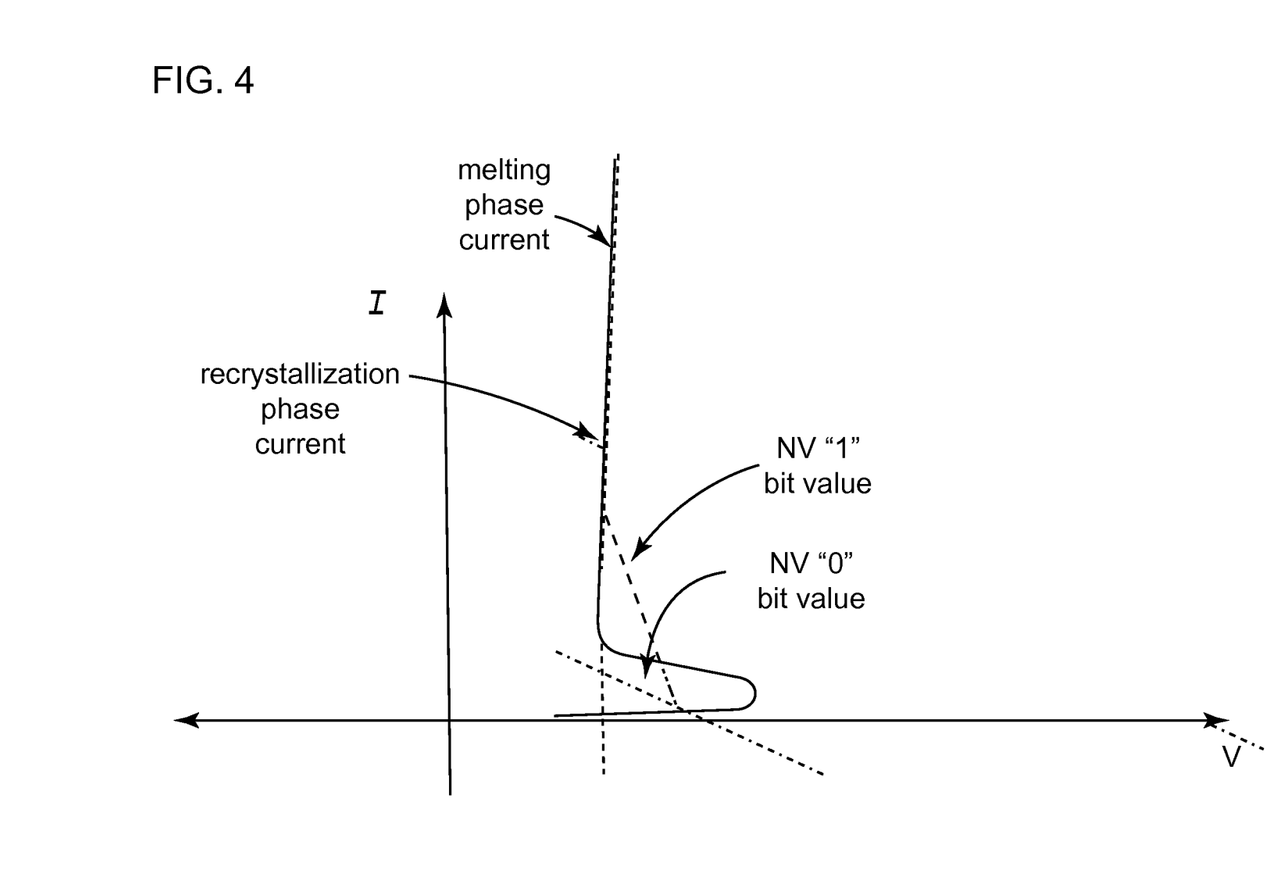
FIG. 4 is showing the current-voltage characteristics of a resistive load element and thyristor device of the thyristor memory cell of FIG. 1 for a high resistance state of the resistive load element corresponding to an NV "0" bit value and for a low resistance state of the resistive load element corresponding to a NV "1" bit value.

In one embodiment, the resistive load element 27 of the thyristor memory cell is realized from a phase change material as described above. This combines two memory functions within a single memory cell—one memory function from the resistive load element, and another memory function from the latching behavior of the thyristor device. This allows the thyristor memory cell to function as a static memory cell (SRAM) as well as a non-volatile memory cell. For normal SRAM operation, the resistive load element 27 is programmed into its low resistance state and the thyristor memory cell operates as shown in FIG. 2. For non-volatile applications, the resistive load element 27 can be programmed into the NV "0" or NV "1" bit values as described above, and the thyristor memory cell operates as shown in FIG. 4.

The configurable nature of the thyristor memory cell as a static memory cell or a non-volatile memory cell has many advantages, including:

The same footprint of memory cell is used.

For high speed function, the SRAM operation can be used.

NV backup operation can be used for certain power modes (i.e., for low-power sleep state or upon sudden loss of power).

Figure 5:
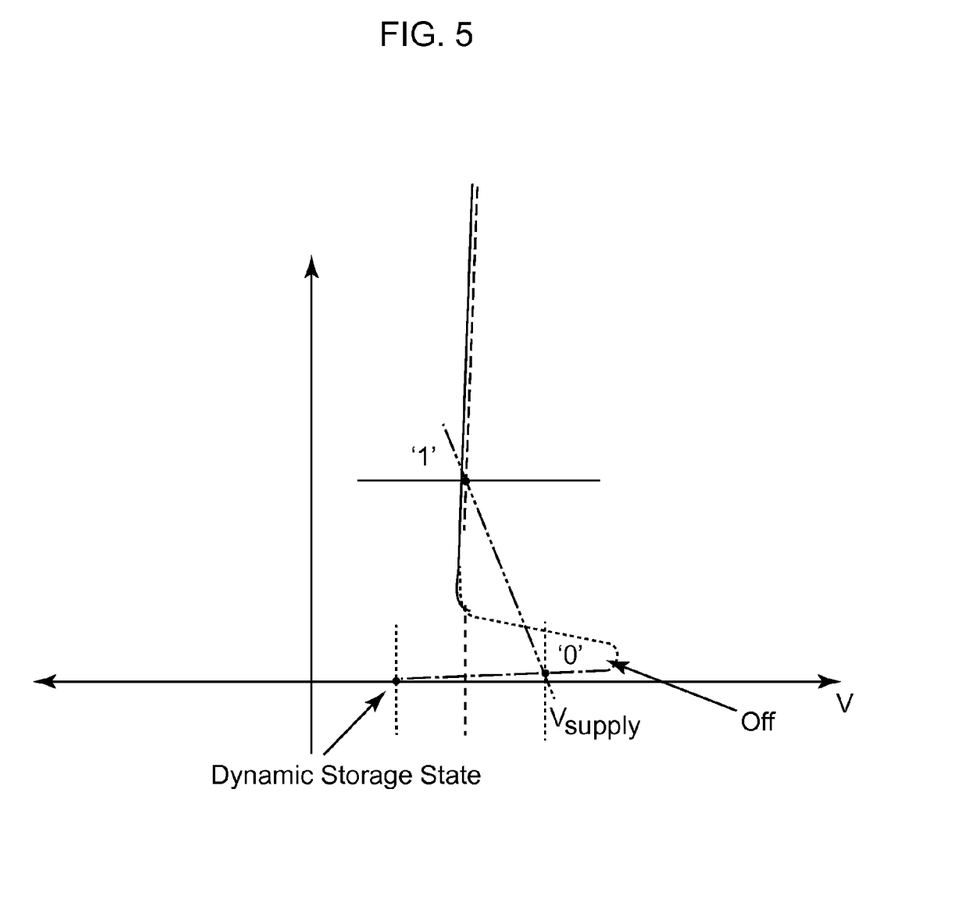
FIG. 5 is a diagram showing the current-voltage characteristics of a resistive load element and thyristor device of the thyristor memory cell of FIG. 1, including such current-voltage characteristics corresponding to volatile "0" and "1" bit values and the voltage level applied to the word line of the thyristor memory cell during the low-power storage state between refresh cycles of the thyristor memory cell.
Figure 6:
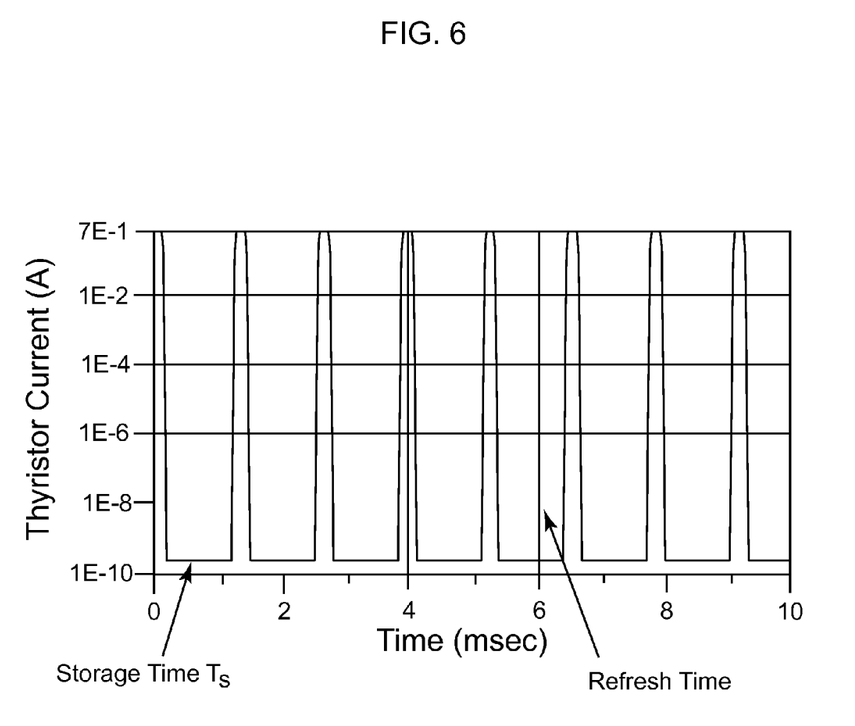
FIG. 6 is a diagram showing the current characteristics of a resistive load element and thyristor device of the thyristor memory cell of FIGS. 1 and 5 during periodic refresh operations.

The thyristor memory cell can also operate a DRAM cell. This is shown in FIG. 5. The states are the same as the SRAM but there is an additional state called the "store" state. Thus, after writing either a volatile "1" or "0" bit value, and during the time that a read operation is not required (these represent substantial periods of time when neither writing nor reading are necessary), the word lines of the respective thyristor memory cells are powered down to a low voltage (e.g., approximately 0.6V), which is labeled "Dynamic Storage State" in FIG. 5. The charge in the quantum well interfaces 11, 14 cannot escape by conduction because the components have been reduced drastically. Also recombination is essentially zero. Therefore, if a volatile "1" bit value is stored by the memory cell, i.e., the quantum well interfaces 11, 13 of the thyristor device of the thyristor memory cell are filled with charge, the quantum well interfaces 11, 13 will remain filled for a long time. Simulations have shown that when the voltage is raised back to the level of the SRAM volatile "1" bit value after 1 msec, there is still enough charge left in the thyristor memory cell to restore the ON state. That means the data has not been lost. If the store time exceeds some long time, say 1 msec, then sufficient charge leaks away that a volatile "0" bit value will be obtained upon increasing the voltage. So a refresh operation is required periodically (e.g., once every msec) as shown in FIG. 6. The advantage gained is ultra-low power. The speed of read and write is identical to the SRAM. Clearly this DRAM has significant advantages which are:

same speed as the SRAM operation.

selective operation of the cell as an SRAM cell or DRAM cell can be controlled by simply disabling the refresh cycle and the store voltage.

the NV backup operation can also be used here as well.

extremely low power operation is possible.

extremely high density is possible.

complex sense amplifiers are not required; the thyristor action is its own sense amplifier and provides a digital output signal on the respective bit line.

not limited by stored charge as in conventional DRAM; the thyristor is an active device which can supply current instead of charge—active read.

Figure 7:
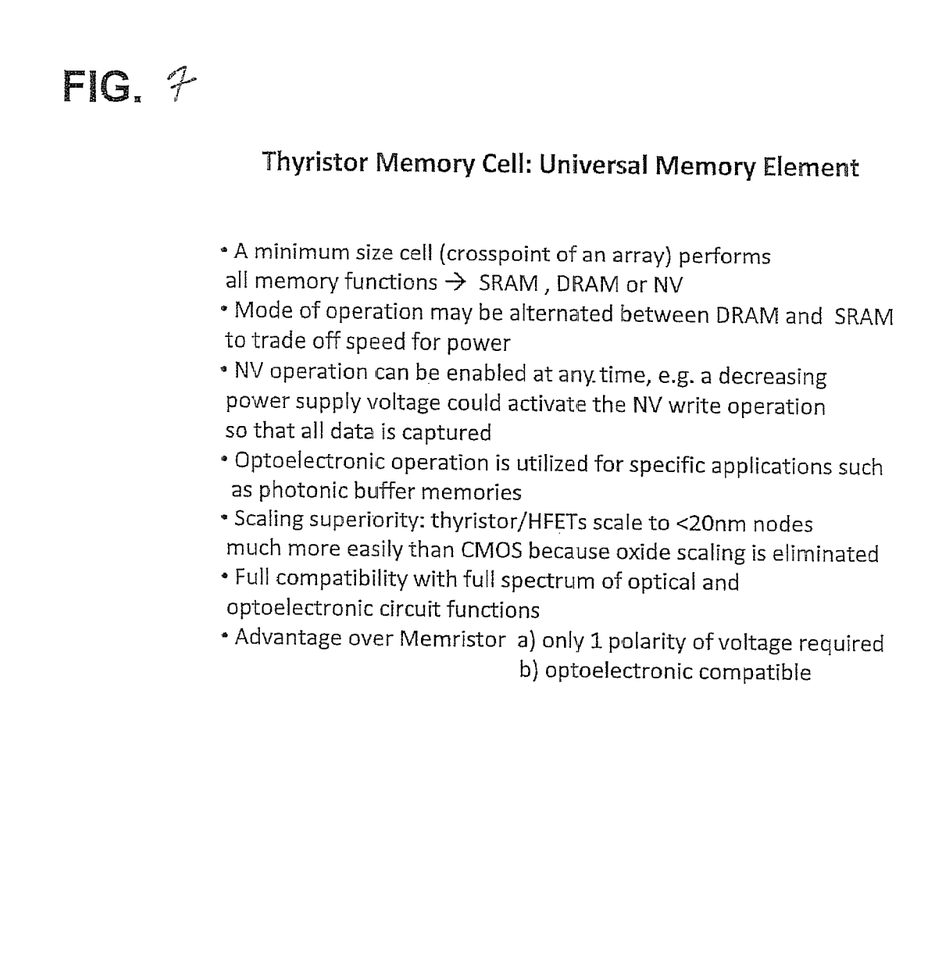
FIG. 7 is a chart that summarizes potential benefits of the thyristor memory cell integrated circuit of the present application.

The advantages of the thyristor memory cell of the present application are summarized in FIG. 7.

Figure 8:
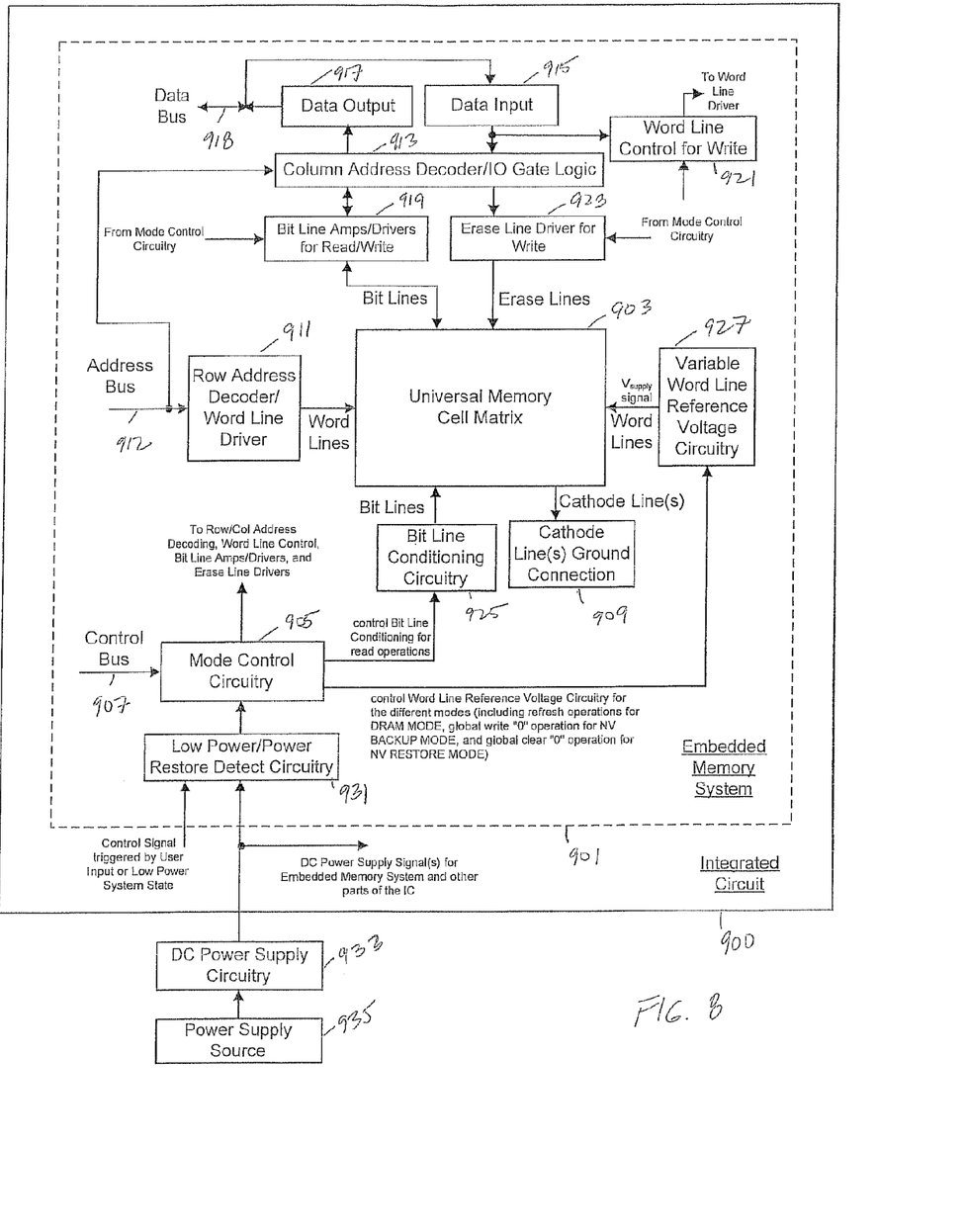
FIG. 8 is a block diagram of an exemplary integrated circuit with a memory system that includes an array of thyristor memory cells in accordance with the present application.

FIG. 8 is a functional block diagram of an integrated circuit 900 that includes a memory system 901 realized by an array (or matrix) 903 of thyristor memory cells as described herein. The thyristor memory cell can be referred to as a universal memory cell because of the multitude of different operational modes (volatile SRAM-like mode, volatile DRAM-like mode, and non-volatile mode) that it can be supported dynamically by the memory cells of the array 903 as needed. The operational mode and the operation (write or read) of the memory system 901 can be dictated dynamically by control data input to mode control circuitry 905 on the control bus 907 as shown. In one illustrative embodiment, the mode control circuitry 905 supports four different operational modes as follows:

1) an SRAM-like mode (referred to as "SRAM MODE") that supports both reading of volatile bit values from the thyristor memory cells of the array 903 and writing of volatile bit values into the thyristor memory cells of the array 903;

2) a reduced-power DRAM-like mode (referred to as "DRAM MODE") that supports both reading of volatile bit values from the thyristor memory cells of the array 903 and writing of volatile bit values into the thyristor memory cells of the array 903 in conjunction with periodic refresh of the thyristor memory cells;

3) an NV BACKUP MODE that programs the resistive state (i.e., high resistive state for an NV "0" bit value or a low resistive state for an NV "1" bit value) of the load resistive elements of the thyristor memory cells of the array 903 according to the volatile bit values stored by the thyristor memory cells in the SRAM MODE or the DRAM MODE; and 4) an NV RESTORE MODE that initializes the state and corresponding volatile bit value (i.e., conducting/ON state corresponding to a volatile "1" bit value or non-conducting/OFF state corresponding to a volatile "0" bit value) of the thyristor memory cells of the array for the SRAM-like mode or DRAM-like mode according to the resistive state of the load resistive elements of the thyristor memory cells of the array dictated by the NV BACKUP MODE.

The phase change material of the resistive load element 27 of each thyristor memory cell of the array 903 can be initially configured in a low resistance state suitable for operation of the SRAM MODE or the DRAM MODE. The cathode terminal 12 for each memory cell of the array 903 is connected to a reference ground potential (or negative potential) 909 by a common cathode line (or possibly multiple cathode lines if desired).

The memory system 901 includes a number of supporting circuits that interface directly (or indirectly) to the array 903, including row address decoding and word line driving circuitry 911 coupled to address bus 912, column address decoding and IO gate logic 913 coupled to address bus 912, a data input block 915 and a data output block 917 coupled between the IO gate logic 913 and a data bus 918, bit line amplifiers and drivers 919 coupled between the bit lines of the array 903 and the IO gate logic 913, word line write control circuitry 921 coupled between the data input block 915 and the word line driver circuitry 911, erase line driver circuitry 923 coupled between the IO gate logic 913 the erase lines of the array 903, bit line conditioning circuitry 925 coupled to the bit lines of the array 903, and word line reference voltage circuitry 927 coupled to the word lines of the array 903.

The row address decoding and word line driving circuitry 911 drives the appropriate word line of the array 903 as designated by row address signals input on the address bus 912. The signaling of the word line is dictated by the operation (read or write) and operational mode as controlled by the mode control circuitry 905 according to the control data input on the control bus 907.

For read operations, the column address decoding and IO gate logic 913 selectively couples the data output block 917 to the bit line amplifier circuitry 919 for the bit line of the array 903 as designated by column address signals input on the address bus 912. For write operations, the column address decoding and IO gate logic 913 couples the data input block 915 to the bit line driver circuitry 919 for the bit line of the array 903 as designated by column address signals input on the address bus 912 and also couples the data input block 915 to the erase line driver circuitry 923 for the erase line of the array 903 as designated by column address signals input on the address bus 912.

The data input block 915 stores the bit value input on the data bus 918 to support write operations where the bit value is stored in a thyristor memory cell of the array 903 by operation of the row address decoding and word line driver circuitry 911, the word line write control circuitry 921, the column address decoding and IO gate logic 913, the bit line driver circuitry 919, and the erase line driver circuitry 923, all of which operate under control of the mode control circuitry 905.

The data output block 917 stores the bit value that is output on the data bus 918 to support read operations where the bit value is read from a thyristor memory cell of the array 903 by operation of the row address decoding and word line driver circuitry 911, the column address decoding and IO gate logic 913, and the bit line amplifier circuitry 919, all of which operate under control of the mode control circuitry 905.

The bit line amplifier and driver circuitry 919 is coupled to the bit lines of the array 903. During read operations, the bit line amplifier circuitry 919 loads the bit value of the selected thyristor memory cell as carried by the associated bit line into the data output block 917 via the IO gate logic 913. During write operations, the bit line driver circuitry 919 drives the bit line with the appropriate signals that controls the state of the thyristor device (i.e., conducting/ON state for a volatile "1" bit value or a non-conducting/OFF state for a volatile "0" bit) of the selected thyristor memory cell as dictated by the bit value of the thyristor memory cell output from the data input block 915 via the IO gate logic 913.

The word line write control circuitry 921 operates during write operations to control the word line driver circuitry 911 to supply the appropriate signals to the selected word line of the array 903 based on the bit value of the selected thyristor memory cell as output by the data input block 915.

The erase line driver circuitry 923 operates during write operations to drive the erase line of the array 903 with appropriate signals that controls the state of the thyristor device (i.e., conducting/ON state for a volatile "1" bit value or a non-conducting/OFF state for a volatile "0" bit) of the selected thyristor memory cell as dictated by the bit value of the thyristor memory cell output from the data input block 915 via the IO gate logic 913.

The bit line conditioning circuitry 925 conditions the bit lines of the array 903 to a desired voltage level prior to a read operation.

The word line reference voltage circuitry 927 operates under control of the mode control circuitry 905 to supply a variable reference voltage signal ($v_{supply}$) to the word lines of the array 903. The level of $v_{supply}$ is varied to support the different operational modes, such as during refresh intervals for the DRAM MODE, for the global write "0" operation for the NV BACKUP MODE, and for the global clear "0" operation of the NV RESTORE MODE.

SRAM Mode

The SRAM MODE involves write operations, read operations, and stand-by operations (between successive write operations and/or read operations). In the SRAM MODE, the mode control circuitry 905 controls the word line reference voltage circuitry 927 to supply the reference voltage signal ($v_{supply}$) to the word lines of the array 903, which is preferably a constant value for all operations including stand-by operations, write operations and read operations. This constant value can be a voltage that maintains the respective thyristor devices of the thyristor memory cells of the array 903 in the conducting/ON state if in the conducting/ON state, which is greater than the characteristic holding voltage of the thyristor devices of the respective thyristor memory cells.

During the stand-by operations of the SRAM MODE, the reference voltage signal ($v_{supply}$) supplied to the word lines of the cells of the array 903 maintains the thyristor devices of the respective thyristor memory cells of the array 903 in the conducting/ON state if in the conducting/ON state, while the thyristor devices of the thyristor memory cells of the array 903 in the non-conducting/OFF state remain in the non-conducting OFF state.

During the write operations of the SRAM MODE, a row and column address for a memory word (which can be stored by one or more thyristor memory cells in a row of the array 903) and corresponding data bit value(s) are input on the address bus 912 and the data bus 918, respectively. The row address decoder circuitry 911 decodes this row address, the column address decoder circuitry 913 decodes this column address, and the data input block 915 stores the corresponding data bit value(s). The mode control circuitry 905 controls the word line driver circuitry 911, which operates in conjunction with the row decoding operations performed by circuitry 911 as well as the control operations of the word line control circuitry 921, to apply appropriate signals to the selected word line of the array 903 based on the bit value of the selected thyristor memory cell as output by the data input block 915. The mode control circuitry 905 also controls the bit line driver circuitry 919, which operates to drive the bit line of the selected thyristor memory cell with the appropriate signals that controls the state of the thyristor device (i.e., conducting/ON state for a volatile "1" bit value or a non-conducting/OFF state for a volatile "0" bit) of the selected thyristor memory cell as dictated by the bit value of the thyristor memory cell output from the data input block 915 via the IO gate logic 913 (according to the column address decoding operations). The mode control circuitry 905 also controls the erase line driver circuitry 923, which operates to drive the erase line of the selected thyristor memory cell with appropriate signals that controls the state of the thyristor device (i.e., conducting/ON state for a volatile "1" bit value or a non-conducting/OFF state for a volatile "0" bit) of the selected thyristor memory cell as dictated by the bit value of the thyristor memory cell output from the data input block 915 via the IO gate logic 913 (according to the column address decoding operations). In the event that the data bit value stored by the data input block 915 for a given thyristor memory cell is a volatile "1" bit value, the bit line driver circuitry 919 is configured to apply a predetermined bias signal to the bit line of the given thyristor memory cell and the erase line driver circuitry 923 is configured to place the erase line of the given thyristor cell into a high impedance state. The predetermined bias signal of the bit line in conjunction with the signal applied to the word line for the given thyristor memory cell by the word line driver circuitry 911 is configured to turn the thyristor device of the thyristor memory cell into the conducting/ON state if it is not in the conducting/ON state already. Thus, the thyristor device of the thyristor memory cell will switch into the conducting/ON state if it was in the non-conducting OFF state, or remain in the conducting/ON state if it was already in the conducting/ON state. In one embodiment, the signal of the bit line injects charge into the thyristor device of the thyristor memory cell to reduce the switching voltage of the thyristor device to a value less than the "quiescent switching voltage" of the thyristor device, which is the switching voltage with the n-channel injector (bit line) and p-channel injector (erase line) of the thyristor device floating in a high impedance state. In the event that the data bit value stored by the data input block 915 for a given thyristor memory cell is a volatile "0" bit value, the erase line driver circuitry 923 is configured to apply a predetermined bias signal to the erase line of the given thyristor memory cell and the bit line driver circuitry 919 is configured to place the bit line of the given thyristor cell into a high impedance state. The predetermined bias signal of the erase line in conjunction with the bias signal applied to the word line for the given thyristor cell by the Word Line Driver Circuitry is configured to turn the thyristor device of the thyristor memory cell into the non-conducting/OFF state if it is not in the non-conducting/OFF state already. Thus, the thyristor device of the thyristor memory cell will switch into the non-conducting/OFF state if it was in the conducting/ON state, or remain in the non-conducting/OFF state if it was already in the non-conducting/OFF state. In one embodiment, the bias signal of the erase line removes charge from the thyristor device of the thyristor memory cell to a value below the characteristic holding charge QH of the thyristor device of the thyristor memory cell.

During the read operations of the SRAM MODE, a row and column address for a memory word (which can be one or more thyristor memory cells in a row of the array) are input on the address bus 912. The row and column addresses are used to read the data bit(s) of the memory word from the corresponding thyristor memory cell(s) of the array 903 and store the data bit(s) in the data output block 917. The mode control circuitry 905 controls the bit line amplifier circuitry 919 to sense (monitor) the current of the bit lines of the array 903, and also controls the word line driver circuitry, which operates in conjunction with the row decoding operations performed by the circuitry 911 to apply a predetermined voltage pulse waveform to the word line for the corresponding word. In the even that that the given thyristor device of the thyristor memory cell of the memory word is in the conducting/ON state (corresponding to a volatile "1" bit value) and the voltage pulse waveform is supplied to the given thyristor memory cell via the word line, the bit line amplifier circuitry 919 will detect a corresponding current pulse on the bit line of the given thyristor memory cell. The column address decoding operations and IO gating operations performed by the circuitry 913 cooperate with the bit line amplifier circuitry 919 for the bit line of the given thyristor memory cell to load the appropriate volatile bit value ("1") of the given thyristor memory cell into the data output block 917. In the event that that the given thyristor device of the thyristor memory cell of the memory word is in the non-conducting/OFF state (corresponding to a volatile "0" bit value) and the voltage pulse waveform is supplied to the given thyristor memory cell via the word line, the bit line amplifier circuitry 919 for the bit line of the thyristor memory cell will detect a lack of a corresponding current pulse on the bit line. The column address decoding and IO gating operations performed by circuitry 913 cooperate with the bit line amplifier circuitry 913 of the bit line for the given thyristor memory cell to load the appropriate non-volatile bit value ("0") of the given thyristor memory cell into the data output block 917.

DRAM Mode

The DRAM MODE involves write operations, read operations, and stand-by operations (between successive write operations and/or read operations) that are similar to those described above for the SRAM MODE. However, the mode control circuitry 905 controls the word line reference voltage circuitry 927 to supply the reference voltage signal ($v_{supply}$) to the word lines of the array 903, where the reference voltage signal ($v_{supply}$) is set to a voltage level (referred to as the Dynamic Storage State above in reference to FIG. 5) that is less than the characteristic holding voltage of the respective thyristor devices of the thyristor memory cells. Furthermore, the mode control circuitry 905 performs a periodic refresh cycle that refreshes all thyristor devices that are in the conducting/ON state such that they remain in the conducting/ON state. Such refresh operations are accomplished by increasing the voltage level of the reference voltage signal ($v_{supply}$) to the voltage level of the SRAM MODE, which is greater than the characteristic holding voltage of the thyristor devices of the respective thyristor memory cells. Examples of such refresh operations are shown in FIG. 6.

NV Backup Mode

The NV BACKUP MODE can be configured by the mode control circuitry 905 in response to a signal supplied by the low power/power restore detect circuitry 931. The low power/power restore detect circuitry 931 can be configured to supply such signal in response to control signals triggered by user input (user pressing Power ON/OFF button for Shutdown or Sleep), by a lower power system state (e.g., Sleep state) triggered by a processor or operating system, or by detecting that a low level of DC power supplied by DC power supply circuitry 933 and a power supply source 935 (such as a battery or mains power) which can occur when a power supply collapse is imminent. In the NV BACKUP MODE, the mode control circuitry 905 controls the word line reference voltage circuitry 927 to carry out a global write "0" operation where a voltage pulse is applied to the word lines 29 of the array. The magnitude of such voltage pulse is above the "quiescent switching voltage" of the thyristor devices of the thyristor memory cells. In conjunction with this pulse, the n-channel injector (bit line) and the p-channel injector (erase line) of the thyristor memory cells float in a high impedance state. For the thyristor memory cells that are in the non-conducing/OFF state (volatile "0" bit value), this pulse will produce a displacement current that causes the phase change material of the resistive load element 27 of the thyristor memory cell to transform by melting to the high resistance state corresponding to the NV "0" bit value. However, for the thyristor memory cells that are in the conducting/ON state (volatile "1" bit value), this pulse will not produce the necessary displacement current (instead, it produces only a conduction current change) and the phase change material of the resistive load element 27 of such thyristor memory cells remains in the low resistance state corresponding to the "NV "1" bit value. In this manner, the global write "0" operation transforms the phase change material of the resistive load elements 27 of the thyristor memory cells of the array that are in the non-conducing/OFF state (volatile "0" bit value) to the high resistance state corresponding to the NV "0" bit value, and does not transform the phase change material for the resistive load elements 27 of the thyristor memory cells of the array that are in the conducting/ON state (volatile "1" bit value) from the low resistance state corresponding to the NV "1" bit value.

NV Restore Mode

The NV RESTORE MODE can be configured by the mode control circuitry 905 in response to a signal supplied by the low power/power restore detect circuitry 931. The low power/power restore detect circuitry 931 can be configured to supply such signal in response to control signals triggered by user input (user pressing Power ON/OFF button for turning ON or Resume), by a Power ON system state triggered by a processor or operating system, or by detecting that the DC power supplied by DC power supply circuitry 933 and a power supply source 935 has returned to normal operating levels. In the NV RESTORE MODE, the mode control circuitry 905 controls the word line reference voltage circuitry 927 to carry out a global clear "0" operation where a voltage pulse is applied to the word lines 29 of the array. The magnitude of the pulse is above the "quiescent switching voltage" of the thyristor devices of the thyristor memory cells of the array. In conjunction with this pulse, the n-channel injector (bit line) is biased and p-channel injector (erase line) of the thyristor memory cells floats in a high impedance state. For the thyristor memory cells with the phase change material of the resistive load element 27 in the high resistance state corresponding to the NV "0" bit value, this pulse will produce a displacement current that causes the phase change material of the resistive load element 27 to transform by recrystallization into the low resistance state. Such displacement current is designed to be less than the displacement current that causes the phase change material of the resistive load element 27 to transform by melting to the high resistance state. The transformation pulse is short enough that the QW interfaces 11, 13 of the thyristor devices have insufficient time to be populated and thus these thyristor devices do not switch into the conducting/ON state, i.e. they remain in the non-conducting/OFF state corresponding to the volatile "0" value. After the transformation pulse, the voltage potential applied to the word lines 29 of the array is reduced to a level below the characteristic switching voltage to cause the transformed thyristor memory cells to operate in the non-conducting/OFF state and assume the desired volatile "0" bit value. For the thyristor memory cells with the phase change material of the resistive load element 27 in the low resistance state corresponding to the NV "1" bit value, the transformation pulse will not produce the necessary displacement current for the transformation of the phase change material of the resistive load element 27. Instead, the transformation pulse produces a conduction current that causes the thyristor devices of the memory cells to operate in the conducting/ON state and assume the desired volatile "1" bit value, and they remain ON when the voltage level is reduced to the level below the holding voltage (because their QW interfaces were already populated and this charge has does not have sufficient time to dissipate in contrast to the transformed thyristor memory cells).

There have been described and illustrated herein several embodiments of a semiconductor memory device employing an array of thyristor memory cells that each include a thyristor device and a resistive load element realized from a phase change material that is electrically programmable into both a low resistance state and a high resistant state. While particular embodiments of the invention have been described, it is not intended that the invention be limited thereto, as it is intended that the invention be as broad in scope as the art will allow and that the specification be read likewise. Thus, while particular memory architecture and systems have been disclosed, it will be appreciated that other particular memory architecture and systems can be used as well. In addition, while particular signaling schemes have been disclosed for operating the thyristor memory cells, it will be understood that other suitable signaling schemes can be used. Moreover, while particular epitaxial layer structures and material systems have been disclosed, it will be appreciated that other epitaxial layer structures and material systems could be used as well. It will therefore be appreciated by those skilled in the art that yet other modifications could be made to the provided invention without deviating from its spirit and scope as claimed.

What is claimed is:

1. A semiconductor memory device comprising:
    an array of memory cells formed on a substrate, each given memory cell including a resistive load element and a thyristor device that define a switchable current path through the resistive load element and the thyristor device of the given memory cell, wherein the resistive load element is realized from a phase change material that can be selectively programmed into one of a high resistive state and a low resistive state by current that flows through the switchable current path of the given memory cell, and wherein the state of the switchable current path of the given memory cell represents a volatile bit value stored by the given memory cell;
    at least one word line corresponding to a first set of memory cells of the array, wherein the word line is coupled to the switchable current path through the resistive load element and thyristor device for the first set of memory cells of the array; and
    at least one bit line corresponding to a second set of memory cells of the array, wherein the bit line is coupled to a modulation doped quantum well interface of the thyristor device for the second set of memory cells of the array;
    wherein each given memory cell is accessed to detect the volatile bit value stored by the given memory cell by applying a voltage pulse to the word line coupled to the switchable current path through the resistive load element and thyristor device of the given memory cell in conjunction with sensing voltage of the bit line coupled to the modulation doped quantum well interface of the thyristor device of the given memory cell.

2. A semiconductor memory device according to claim 1, further comprising:
    first circuitry configured to apply a first electrical signal to at least one word line in order to generate current that programs the phase change material of the resistive load elements of memory cells of the array into one of the high resistive state and the low resistive state according to the state of the switchable current path of the memory cells of the array for non-volatile backup of the volatile bit values stored by the memory cells of the array.

3. A semiconductor memory device according to claim 2, wherein:
    the first electrical signal is applied to every word line of the array and comprises a first time-varying voltage signal that generates the current that programs the phase change material of the resistive load elements of all of the memory cells of the array.

4. A semiconductor memory device according to claim 3, wherein:
    for memory cells of the array where the switchable current path of the given memory cell is in a non-conducting/OFF state corresponding to a first volatile bit value, the first time-varying voltage signal produces current that transforms the phase change material of the resistive load element of the given memory cell by melting to the high resistance state corresponding to a first non-volatile bit value; and for memory cells of the array where the switchable current path of the given memory cell is in a conducting/ON state corresponding to a second volatile bit value, the first time-varying voltage signal produces current that does not transform the phase change material of the resistive load element of the given memory cell such that it remains in a low resistance state corresponding to a second non-volatile bit value.

5. A semiconductor memory device according to claim 2, wherein:

the first circuitry is further configured to apply a second electrical signal to the at least one word line of the array in order to generate current that programs the phase change material of the resistive load elements of memory cells of the array into the low resistive state as well as setting the state of the switchable current path of the memory cells of the array according to the non-volatile bit values stored by the memory cells of the array for restoring the volatile bit values stored by the memory cells of the array from non-volatile backup.

6. A semiconductor memory device according to claim 5, wherein:

the second electrical signal is applied to every word line of the array and comprises a second time-varying voltage signal that generates the current that programs the phase change material of the resistive load elements of all of the memory cells of the array as well as setting the state of the switchable current path of all of the memory cells of the array.

7. A semiconductor memory device according to claim 6, wherein:

for memory cells of the array where the phase change material of the resistive load element of the given memory cell is in a high resistance state corresponding to the first non-volatile bit value, the second time-varying voltage signal produces current that transforms the phase change material of the resistive load element of the given memory cell by recrystallization into the low resistance state and sets the state of the switchable current path of the given memory cell into a non-conducting/OFF state corresponding to the first volatile bit value; and for memory cells of the array where the phase change material of the resistive load element of the given memory cell is in a low resistance state corresponding to the second non-volatile bit value, the second time-varying voltage signal produces current that does not transform the phase change material of the resistive load element of the given memory cell such that it remains in the low resistance state and sets the state of the switchable current path of the given memory cell into a conducting/ON state corresponding to the second volatile bit value.

8. A semiconductor memory device according to claim 7, wherein:

the second time-varying voltage signal comprises a voltage pulse followed by a reduction in voltage to a level below the switching voltage of the thyristor devices of the memory cells of the array.

9. A semiconductor memory device according to claim 1, wherein:

the thyristor devices of the memory cells of the array include a first-type modulation doped interface spaced from a second-type modulation doped interface; and a given bit line is coupled to the first-type modulation doped quantum well interface of the thyristor for the corresponding second set of memory cells of the array.

10. A semiconductor memory device according to claim 9, further comprising:

at least one erase line corresponding to the second set of memory cells of the array, wherein the erase line is coupled to the second-type modulation doped quantum well interface of the thyristor device for the second set of memory cells of the array.

11. A semiconductor memory device according to claim 1, wherein:

the thyristor device of each memory cell is realized from an epitaxial layer structure formed on the substrate, wherein the epitaxial layer structure defines complementary n-type and p-type modulation doped quantum well interfaces.

12. A semiconductor memory device according to claim 11, wherein:

a given bit line is coupled to the n-type modulation doped quantum well interface of the thyristor for the corresponding second set of memory cells of the array.

13. A semiconductor memory device according to claim 12, further comprising:

at least one erase line corresponding to the second set of memory cells of the array, wherein the erase line is coupled to the p-type modulation doped quantum well interface of the thyristor device for the second set of memory cells of the array.

14. A semiconductor memory device according to claim 11, wherein:

the epitaxial layer structure includes an N+ type doped layer, a first plurality of layers forming a p type modulation doped quantum well interface spaced from said N+ type doped layer, a second plurality of layers forming an n-type modulation doped quantum well interface, said first plurality of layers being separated from said second plurality of layers, and a P+ type doped layer spaced from said second plurality of layers.

15. A semiconductor memory device according to claim 14, wherein:

said p-type modulation doped quantum well interface includes at least one quantum well separated from a p-type doped charge sheet by at least one undoped spacer layer; and said n-type modulation doped quantum well interface includes at least one quantum well separated from an n-type doped charge sheet by at least one undoped spacer layer.

16. A semiconductor memory device according to claim 14, wherein:

said p-type modulation doped quantum well interface is formed above said N+ type doped layer.

17. A semiconductor memory device according to claim 1, wherein:

the phase change material of the resistive load elements of the memory cells of the array comprise a chalcogenide glass material.

18. A semiconductor memory device according to claim 1, wherein:

the volatile bit values stored by the state of the switchable current path of the memory cells are periodically refreshed between low power dynamic storage states.

19. A semiconductor memory device according to claim 1, wherein:
the memory cells of the array are configured for at least one of SRAM operation, non-volatile RAM operation, and DRAM operation.

* * * * *